(12) United States Patent
Lee

(10) Patent No.: US 11,980,077 B2
(45) Date of Patent: *May 7, 2024

(54) PIXEL ARRANGEMENT STRUCTURE FOR ORGANIC LIGHT EMITTING DISPLAY DEVICE

(71) Applicant: SAMSUNG DISPLAY CO., LTD., Yongin-si (KR)

(72) Inventor: Sang-Shin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/175,351

(22) Filed: Feb. 27, 2023

(65) Prior Publication Data

US 2023/0209947 A1   Jun. 29, 2023

Related U.S. Application Data

(63) Continuation of application No. 16/505,536, filed on Jul. 8, 2019, now Pat. No. 11,594,578, which is a
(Continued)

(30) Foreign Application Priority Data

Mar. 6, 2012   (KR) ........................ 10-2012-0022967

(51) Int. Cl.
*G09G 3/32* (2016.01)
*H01L 27/32* (2006.01)
*H10K 59/35* (2023.01)

(52) U.S. Cl.
CPC ......... *H10K 59/352* (2023.02); *H10K 59/353* (2023.02)

(58) Field of Classification Search
CPC ........................... H01L 27/32; H01L 27/3216
See application file for complete search history.

(56) References Cited

U.S. PATENT DOCUMENTS 3,971,065 A   7/1976   Bayer
4,491,863 A   1/1985   Kurahashi
(Continued)

FOREIGN PATENT DOCUMENTS

CN   1726593 A   1/2006
CN   1874000 A   12/2006
(Continued)

OTHER PUBLICATIONS

U.S. Office Action dated Sep. 19, 2022, issued in U.S. Appl. No. 17/808,985 (25 pages).
(Continued)

*Primary Examiner* — Kwang-Su Yang
(74) *Attorney, Agent, or Firm* — Lewis Roca Rothgerber Christie LLP

(57) ABSTRACT

A pixel arrangement structure of an OLED display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

59 Claims, 5 Drawing Sheets

Related U.S. Application Data continuation of application No. 15/811,599, filed on Nov. 13, 2017, now Pat. No. 10,854,683, which is a continuation of application No. 13/614,197, filed on Sep. 13, 2012, now Pat. No. 9,818,803.

(56) References Cited

U.S. PATENT DOCUMENTS

| | | |
|---|---|---|
| 4,642,619 A | 2/1987 | Togashi |
| 4,965,565 A | 10/1990 | Noguchi |
| 5,113,274 A | 5/1992 | Takahashi et al. |
| 5,142,392 A | 8/1992 | Ueki et al. |
| 5,461,503 A | 10/1995 | Deffontaines et al. |
| 5,485,293 A | 1/1996 | Robinder |
| 5,742,129 A | 4/1998 | Nagayama et al. |
| 6,198,507 B1 | 3/2001 | Ishigami |
| 6,326,981 B1 | 12/2001 | Mori et al. |
| 6,366,025 B1 | 4/2002 | Yamada |
| 6,552,706 B1 | 4/2003 | Ikeda et al. |
| 6,747,618 B2 | 6/2004 | Arnold et al. |
| 6,838,819 B2 | 1/2005 | Kim et al. |
| 6,867,549 B2 | 3/2005 | Cok et al. |
| 6,882,364 B1 | 4/2005 | Inuiya et al. |
| 6,897,855 B1 | 5/2005 | Matthies et al. |
| 6,933,976 B1 | 8/2005 | Suzuki |
| 6,950,115 B2 | 9/2005 | Brown Elliott |
| 7,075,242 B2 | 7/2006 | Miller et al. |
| 7,091,986 B2 | 8/2006 | Phan |
| 7,110,031 B2 | 9/2006 | Kondo et al. |
| 7,184,067 B2 | 2/2007 | Miller et al. |
| 7,187,425 B2 | 3/2007 | Yamazaki |
| 7,215,347 B2 | 5/2007 | Phan |
| 7,230,594 B2 | 6/2007 | Miller et al. |
| 7,250,722 B2 | 7/2007 | Cok et al. |
| 7,274,383 B1 | 9/2007 | Brown Elliot |
| 7,291,970 B2 | 11/2007 | Kuwabara |
| 7,301,273 B2 | 11/2007 | Dedene et al. |
| 7,397,485 B2 | 7/2008 | Miller et al. |
| 7,612,811 B2 | 11/2009 | Takeushi et al. |
| 7,646,430 B2 | 1/2010 | Brown Elliott et al. |
| 7,710,484 B2 | 5/2010 | Oda |
| 7,755,652 B2 | 7/2010 | Credelle et al. |
| 7,982,786 B2 | 7/2011 | Nishida et al. |
| 8,026,669 B2 | 9/2011 | Kawasaki et al. |
| 8,026,869 B2 | 9/2011 | Takagi et al. |
| 8,118,633 B2 | 2/2012 | Yuasa |
| 8,134,583 B2 | 3/2012 | Credelle |
| 8,159,511 B2 | 4/2012 | Brown Elliott et al. |
| 8,223,168 B2 | 7/2012 | Brown Elliott et al. |
| 8,294,741 B2 | 10/2012 | Elliot et al. |
| 8,330,352 B2 | 12/2012 | Sung et al. |
| 8,334,859 B2 | 12/2012 | Liu et al. |
| 8,350,468 B2 | 1/2013 | Ko et al. |
| 8,354,789 B2 | 1/2013 | Kim et al. |
| 8,363,072 B2 | 1/2013 | Hong et al. |
| 8,395,157 B2 | 3/2013 | Park et al. |
| 8,405,692 B2 | 3/2013 | Brown Elliott et al. |
| 8,421,820 B2 | 4/2013 | Brown Elliott et al. |
| 8,456,496 B2 | 6/2013 | Credelle |
| 8,519,910 B2 | 8/2013 | Park et al. |
| 8,519,917 B2 | 8/2013 | Ryu et al. |
| 8,552,635 B2 | 10/2013 | Kim et al. |
| 8,587,003 B2 | 11/2013 | Ando |
| 8,754,913 B2 | 6/2014 | Hwang et al. |
| 8,830,275 B2 | 9/2014 | Higgins |
| 8,853,016 B2 | 10/2014 | Park et al. |
| 8,866,707 B2 | 10/2014 | Koyama et al. |
| 8,883,532 B2 | 11/2014 | Ando |
| 9,041,625 B2 | 5/2015 | Hwang et al. |
| 9,355,601 B2 | 5/2016 | Brown Elliott |
| 9,398,205 B2 | 7/2016 | Côté et al. |
| 9,431,469 B2 | 8/2016 | Park et al. |
| 9,837,476 B2 | 12/2017 | Park et al. |
| 10,403,211 B2 | 9/2019 | Hai et al. |
| 10,854,683 B2 | 12/2020 | Lee |
| 11,594,578 B2 * | 2/2023 | Lee .............. H10K 59/352 |
| 2002/0015110 A1 | 2/2002 | Brown Elliott |
| 2002/0070909 A1 | 6/2002 | Asano et al. |
| 2002/0113195 A1 | 8/2002 | Osada |
| 2002/0140833 A1 | 10/2002 | Hirai |
| 2003/0076454 A1 | 4/2003 | Burroughes |
| 2003/0117423 A1 | 6/2003 | Brown-Elliott et al. |
| 2003/0128179 A1 | 7/2003 | Credelle |
| 2003/0128225 A1 | 7/2003 | Credelle et al. |
| 2003/0218618 A1 | 11/2003 | Phan |
| 2004/0036421 A1 | 2/2004 | Arnold et al. |
| 2004/0046714 A1 | 3/2004 | Brown Elliott |
| 2004/0108818 A1 | 6/2004 | Cok et al. |
| 2004/0113875 A1 | 6/2004 | Miller et al. |
| 2004/0150651 A1 | 8/2004 | Phan |
| 2004/0183764 A1 | 9/2004 | Kim et al. |
| 2004/0246426 A1 | 12/2004 | Wang et al. |
| 2005/0001542 A1 | 1/2005 | Kiguchi |
| 2005/0116615 A1 | 6/2005 | Matsumoto et al. |
| 2005/0162079 A1 | 7/2005 | Sakamoto |
| 2005/0225575 A1 | 10/2005 | Elliott et al. |
| 2006/0119738 A1 | 6/2006 | Kido |
| 2006/0152531 A1 | 7/2006 | Lin et al. |
| 2006/0274090 A1 | 12/2006 | Koyama et al. |
| 2007/0164335 A1 | 7/2007 | McKee |
| 2007/0230818 A1 | 10/2007 | Messing et al. |
| 2008/0001525 A1 | 1/2008 | Chao et al. |
| 2008/0001527 A1 | 1/2008 | Koo et al. |
| 2008/0018765 A1 | 1/2008 | Choi et al. |
| 2008/0273793 A1 | 11/2008 | Oishi |
| 2008/0308819 A1 | 12/2008 | Louwsma et al. |
| 2009/0027377 A1 | 1/2009 | Kwon |
| 2009/0194780 A1 | 8/2009 | Kwon |
| 2009/0302331 A1 | 12/2009 | Smith et al. |
| 2009/0321727 A1 | 12/2009 | Yutani et al. |
| 2010/0033084 A1 | 2/2010 | Ko et al. |
| 2010/0045695 A1 | 2/2010 | Brown Elliott et al. |
| 2010/0117528 A1 | 5/2010 | Fukuda |
| 2010/0117936 A1 | 5/2010 | Lhee et al. |
| 2010/0133994 A1 | 6/2010 | Song et al. |
| 2010/0171440 A1 | 7/2010 | Satou et al. |
| 2010/0253608 A1 | 10/2010 | Kim et al. |
| 2010/0315318 A1 | 12/2010 | Lee et al. |
| 2011/0012820 A1 | 1/2011 | Kim et al. |
| 2011/0018858 A1 | 1/2011 | Ryu et al. |
| 2011/0084955 A1 | 4/2011 | Kim |
| 2011/0115772 A1 | 5/2011 | Chung |
| 2011/0177640 A1 | 7/2011 | Han et al. |
| 2011/0215302 A1 | 9/2011 | Lhee et al. |
| 2011/0216056 A1 | 9/2011 | Yoo et al. |
| 2011/0260951 A1 | 10/2011 | Hwang et al. |
| 2011/0291549 A1 | 12/2011 | Kim et al. |
| 2011/0291550 A1 | 12/2011 | Kim et al. |
| 2011/0298836 A1 | 12/2011 | Komiya et al. |
| 2011/0316892 A1 | 12/2011 | Sung et al. |
| 2012/0049726 A1 | 3/2012 | Yoo et al. |
| 2012/0056531 A1 | 3/2012 | Park et al. |
| 2012/0086330 A1 | 4/2012 | Umeda et al. |
| 2012/0176298 A1 | 7/2012 | Suh et al. |
| 2012/0287605 A1 | 11/2012 | Chen et al. |
| 2012/0313844 A1 | 12/2012 | Im et al. |
| 2012/0319564 A1 | 12/2012 | Ghosh et al. |
| 2013/0002911 A1 | 1/2013 | Miyashita et al. |
| 2013/0037827 A1 | 2/2013 | Levermore et al. |
| 2013/0057521 A1 | 3/2013 | Kim |
| 2013/0106891 A1 | 5/2013 | Matsueda et al. |
| 2013/0127689 A1 | 5/2013 | Gollier |
| 2014/0191202 A1 | 7/2014 | Shim et al. |
| 2015/0187273 A1 | 7/2015 | Chang et al. |
| 2015/0192834 A1 | 7/2015 | Morinaga et al. |
| 2016/0124557 A1 | 5/2016 | Choi |
| 2016/0171930 A1 | 6/2016 | Song et al. |
| 2016/0190166 A1 | 6/2016 | Kim et al. |
| 2019/0333970 A1 | 10/2019 | Lee |
| 2020/0394955 A1 | 12/2020 | Lee |

(56) References Cited

U.S. PATENT DOCUMENTS

| | | |
|---|---|---|
| 2022/0319406 A1 | 10/2022 | Lee |
| 2023/0245620 A1 | 8/2023 | Lee |

FOREIGN PATENT DOCUMENTS

| | | |
|---|---|---|
| CN | 101009304 A | 8/2007 |
| CN | 100439989 C | 12/2008 |
| CN | 100448020 C | 12/2008 |
| CN | 101449382 A | 6/2009 |
| CN | 102354479 A | 2/2012 |
| CN | 103311266 A | 9/2013 |
| CN | 203260586 U | 10/2013 |
| CN | 105206647 A | 12/2015 |
| EP | 0 322 106 A2 | 6/1989 |
| EP | 1168448 A2 | 1/2002 |
| EP | 1450408 A2 | 8/2004 |
| EP | 2 637 209 A1 | 9/2013 |
| GB | 2 437 110 A | 10/2007 |
| JP | H01-181074 U | 12/1989 |
| JP | 02-000826 A | 1/1990 |
| JP | 03-078390 A | 4/1991 |
| JP | 3-36239 | 5/1991 |
| JP | 8-227276 A | 9/1996 |
| JP | 08-335060 A | 12/1996 |
| JP | 09-182091 A | 7/1997 |
| JP | 10-39791 | 2/1998 |
| JP | 2000-235891 | 8/2000 |
| JP | 2001-33757 A | 2/2001 |
| JP | 2001-54127 A | 2/2001 |
| JP | 2001-76881 A | 3/2001 |
| JP | 3203907 B2 | 9/2001 |
| JP | 2001-290441 A | 10/2001 |
| JP | 2003-203770 A | 7/2003 |
| JP | 2004-507773 | 3/2004 |
| JP | 2004-117431 A | 4/2004 |
| JP | 2004-179028 A | 6/2004 |
| JP | 2004-192813 | 7/2004 |
| JP | 2005-5227 A | 1/2005 |
| JP | 2005-62416 | 3/2005 |
| JP | 2005-63787 A | 3/2005 |
| JP | 2005-515505 A | 5/2005 |
| JP | 2005-352140 A | 12/2005 |
| JP | 4496852 B2 | 12/2005 |
| JP | 2006-18195 A | 1/2006 |
| JP | 2006-163316 A | 6/2006 |
| JP | 2006-309182 | 11/2006 |
| JP | 2007-156126 A | 6/2007 |
| JP | 2008-015521 | 1/2008 |
| JP | 2008-277264 A | 11/2008 |
| JP | 2008-298966 A | 12/2008 |
| JP | 2008-300367 A | 12/2008 |
| JP | 2009-230096 A | 10/2009 |
| JP | 2010-3880 A | 1/2010 |
| JP | 2010-153173 A | 7/2010 |
| JP | 2011-076760 | 4/2011 |
| JP | 2011-198761 A | 10/2011 |
| JP | 2012-15129 A | 1/2012 |
| JP | 2012-19206 A | 1/2012 |
| JP | 2012-028170 A | 2/2012 |
| JP | 2012-79631 A | 4/2012 |
| JP | 5177957 B2 | 4/2013 |
| JP | 2022-046648 A | 3/2022 |
| KR | 10-2004-0096706 A | 11/2004 |
| KR | 10-2006-0118868 A | 11/2006 |
| KR | 10-0742370 B1 | 7/2007 |
| KR | 10-0807524 B1 | 2/2008 |
| KR | 10-2008-0111130 | 12/2008 |
| KR | 10-2009-0017910 A | 2/2009 |
| KR | 10-2009-0049515 A | 5/2009 |
| KR | 10-2011-0023996 A | 3/2011 |
| KR | 10-2011-0039773 A | 4/2011 |
| KR | 10-1056258 B1 | 8/2011 |
| KR | 10-2011-0106565 A | 9/2011 |
| KR | 10-2011-0108050 A | 10/2011 |
| KR | 10-2011-0117613 A | 10/2011 |
| KR | 10-2011-0129531 | 12/2011 |
| KR | 10-2012-0000887 A | 1/2012 |
| KR | 10-2012-0014074 A | 2/2012 |
| KR | 10-2012-0022967 A | 3/2012 |
| KR | 10-1332495 B1 | 11/2013 |
| KR | 10-2020-0000840 A | 1/2020 |
| KR | 102585302 B1 | 10/2023 |
| TW | 200305126 A | 10/2003 |
| TW | I277930 B | 4/2007 |
| TW | I328207 | 8/2010 |
| WO | WO 03/053068 A2 | 6/2003 |
| WO | WO 03/060870 A1 | 7/2003 |
| WO | WO 2004/073356 A1 | 8/2004 |
| WO | WO 2005/067352 A1 | 7/2005 |

OTHER PUBLICATIONS

U.S. Office Action dated Oct. 14, 2022, issued in U.S. Appl. No. 17/808,982 (25 pages).
U.S. Office Action dated Oct. 14, 2022, issued in U.S. Appl. No. 17/808,983 (23 pages).
U.S. Notice of Allowance dated Dec. 23, 2022, issued in U.S. Appl. No. 16/505,536 (9 pages).
U.S. Office Action dated Jan. 4, 2023, issued in U.S. Appl. No. 17/808,985 (27 pages).
U.S. Office Action dated Nov. 3, 2022, issued in U.S. Appl. No. 17/808,984 (25 pages).
U.S. Office Action dated Nov. 10, 2022, issued in U.S. Appl. No. 17/865,304 (23 pages).
Chinese Office Action dated Sep. 13, 2022, issued in Chinese Patent Application No. 201910040602.2 (9 pages).
Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 12 pages.
English translation of Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 15 pages.
English translation of Petition for Patent Invalidation of Chinese Patent No. ZL201310035429.X (corresponding to U.S. Pat. No. 9,818,803) dated Dec. 22, 2020, 31 pages.
English translation of Petition for Patent Invalidation of Chinese Patent No. ZL201510595095.0 (corresponding to U.S. Pat. No. 9,818,803) dated Jan. 22, 2021, 26 pages.
U.S. Advisory Action from U.S. Appl. No. 13/614,197, dated Feb. 5, 2016, 3 pages.
U.S. Notice of Allowance from U.S. Appl. No. 14/059,356, dated Sep. 10, 2015, 5 pages.
U.S. Restriction Requirement from U.S. Appl. No. 13/614,197, dated Aug. 18, 2014, 7 pages.
U.S. Restriction Requirement from U.S. Appl. No. 16/505,536, dated Aug. 5, 2019, 7 pages.
Advisory Action for U.S. Appl. No. 13/614,197 dated May 18, 2015, 3 pages.
Advisory Action for U.S. Appl. No. 13/872,018 dated Nov. 14, 2016, 3 pages.
Advisory Action for U.S. Appl. No. 13/872,018 dated Dec. 8, 2015, 3 pages.
Advisory Action for U.S. Appl. No. 16/505,536 dated Apr. 7, 2021, 3 pages.
Ex Parte Quayle Action for U.S. Appl. No. 13/614,197 dated Jan. 5, 2017, 5 pages.
Ex Parte Quayle Action for U.S. Appl. No. 15/090,591 dated Aug. 5, 2016, 6 pages.
Final Office Action for U.S. Appl. No. 13/614,197 dated Dec. 2, 2015, 11 pages.
Final Office Action for U.S. Appl. No. 13/872,018 dated May 11, 2017, 16 pages.
Final Office Action for U.S. Appl. No. 13/872,018 dated Jun. 23, 2016, 12 pages.

(56) References Cited

OTHER PUBLICATIONS

Final Office Action for U.S. Appl. No. 13/872,018 dated Oct. 16, 2015, 15 pages.
Final Office Action for U.S. Appl. No. 14/059,356 dated Jun. 18, 2015, 15 pages.
Final Office Action for U.S. Appl. No. 15/811,599 dated Jan. 21, 2020, 18 pages.
Final Office Action for U.S. Appl. No. 16/505,536 dated Oct. 27, 2020, 15 pages.
Notice of Allowance for U.S. Appl. No. 13/614,197 dated Mar. 22, 2017, 7 pages.
Notice of Allowance for U.S. Appl. No. 13/614,197 dated Jul. 11, 2017, 7 pages.
Notice of Allowance for U.S. Appl. No. 13/872,018 dated Feb. 19, 2020, 5 pages.
Notice of Allowance for U.S. Appl. No. 13/872,018 dated May 28, 2020, 5 pages.
Notice of Allowance for U.S. Appl. No. 14/059,356 dated Apr. 27, 2016, 5 pages.
Notice of Allowance for U.S. Appl. No. 14/059,356 dated Nov. 25, 2015, 5 pages.
Notice of Allowance for U.S. Appl. No. 15/090,591 dated Feb. 13, 2017, 5 pages.
Notice of Allowance for U.S. Appl. No. 15/090,591 dated Jul. 31, 2017, 5 pages.
Notice of Allowance for U.S. Appl. No. 15/090,591 dated Dec. 9, 2016, 5 pages.
Notice of Allowance for U.S. Appl. No. 15/688,760 dated Jan. 30, 2019, 5 pages.
Notice of Allowance for U.S. Appl. No. 15/688,760 dated Sep. 14, 2018, 5 pages.
Notice of Allowance for U.S. Appl. No. 15/811,599 dated Feb. 14, 2019, 7 pages.
Notice of Allowance for U.S. Appl. No. 15/811,599 dated Mar. 31, 2020, 5 pages.
Notice of Allowance for U.S. Appl. No. 15/811,599 dated Jul. 10, 2020, 5 pages.
Notice of Allowance for U.S. Appl. No. 16/261,437 dated Jan. 10, 2020, 6 pages.
Notice of Allowance for U.S. Appl. No. 16/261,437 dated Apr. 27, 2020, 5 pages.
Notice of Allowance for U.S. Appl. No. 16/261,437 dated Aug. 14, 2020, 5 pages.
Notice of Allowance for U.S. Appl. No. 16/261,437 dated Dec. 28, 2020, 5 pages.
Office Action for U.S. Appl. No. 13/872,018 dated Feb. 29, 2016, 14 pages.
Office Action for U.S. Appl. No. 13/872,018 dated Jun. 30, 2015, 13 pages.
Office Action for U.S. Appl. No. 13/872,018 dated Dec. 30, 2016, 14 pages.
Patent Board Decision on Appeal for U.S. Appl. No. 13/872,018 dated Dec. 2, 2019, 8 pages.
Restriction Requirement for U.S. Appl. No. 13/872,018 dated Nov. 5, 2014, 8 pages.
Restriction Requirement for U.S. Appl. No. 15/811,599 dated Mar. 28, 2018, 7 pages.
U.S. Office Action from U.S. Appl. No. 16/505,536, dated May 11, 2022, 53 pages.
U.S. Final Office Action dated Nov. 24, 2021, issued in U.S. Appl. No. 16/505,536 (19 pages).
U.S. Office Action dated Oct. 21, 2020, issued in U.S. Appl. No. 16/882,384 (24 pages).
U.S. Office Action dated May 25, 2021, issued in U.S. Appl. No. 16/505,536 (15 pages).
U.S. Final Office Action dated Feb. 1, 2021, issued in U.S. Appl. No. 16/505,536 (8 pages).
U.S. Office Action dated Apr. 30, 2020, issued in U.S. Appl. No. 16/505,536 (14 pages).
U.S. Office Action dated Sep. 3, 2019, issued in U.S. Appl. No. 16/261,437 (11 pages).
U.S. Office Action dated Oct. 25, 2019, issued in U.S. Appl. No. 16/505,536 (14 pages).
Office action issued in U.S. Appl. No. 15/811,599 by the USPTO, dated Jul. 19, 2019, 19 pages.
U.S. Office Action dated Jul. 11, 2018, issued in U.S. Appl. No. 15/811,599 (19 pages).
U.S. Office Action dated Mar. 19, 2018, issued in U.S. Appl. No. 15/688,760 (13 pages).
EPO Communication Pursuant to Article 94(3) EPC, for Patent Application No. 13 178 648.5, dated Jan. 31, 2019, 8 pages.
English Abstract of TW 2008-02221 A, also published as TW I328207, listed above.
TIPO Office Action dated Oct. 11, 2016, for corresponding Taiwanese Patent Application No. 102124953 (6 pages).
U.S. Office Action dated Oct. 14, 2016 issued in cross-reference U.S. Appl. No. 13/614,197 (12 pages).
KIPO Office action dated Jul. 11, 2016, with English translation, for corresponding Korean Patent application 10-2016-0047800, (11 pages).
JPO Office action dated Feb. 16, 2016, corresponding to Japanese Patent application 2012-108855, (5 pages).
U.S. Office action dated Apr. 7, 2016, for U.S. Appl. No. 13/614,197, (13 pages).
EPO Search Report dated Jul. 8, 2013, for corresponding European Patent application 13157562.3, (6 pages).
Extended European Search Report dated Dec. 20, 2013, for corresponding European Patent Application No. 13178648.5 (9 pages).
Korean Patent Abstracts for Korean Publication 1020070055908 dated May 31, 2007, corresponding to Korean Patent 10-0742370 dated Jul. 24, 2007, listed above.
EPO Search Report dated Jul. 9, 2014, for European Patent application 14155124.2, (8 pages).
U.S. Office action dated Nov. 7, 2014, for cross reference U.S. Appl. No. 13/614,197, (16 pages).
U.S. Office action dated Aug. 29, 2014, for cross reference U.S. Appl. No. 14/059,356, (18 pages).
U.S. Office action dated Mar. 12, 2015, for cross reference U.S. Appl. No. 13/614,197, (13 pages).
SIPO Office action dated Mar. 11, 2015, corresponding to Chinese Patent application 201310035429.X, (7 pages).
Taiwan Office action dated Mar. 30, 2015, corresponding to Taiwanese Patent application 102101000, (7 pages).
Korean Patent Abstracts of Korean Publication No. 10-2003-0031207 A, published Apr. 21, 2003, which corresponds to KR 10-0807524 B1, 2 pages.
U.S. Office action dated Jul. 15, 2015, for cross reference U.S. Appl. No. 13/614,197, (11 pages).
U.S. Office action dated Dec. 2, 2015, for cross reference U.S. Appl. No. 13/614,197, (12 pages).
U.S. Office action dated Jul. 8, 2022, issued in U.S. Appl. No. 17/005,753 (48 pages).
U.S. Final Office action dated Nov. 24, 2021, issued in U.S. Appl. No. 17/005,753 (13 pages).
U.S. Office action dated Apr. 13, 2021, issued in U.S. Appl. No. 17/005,753 (22 pages).
U.S. Office action dated Sep. 2, 2016, issued in U.S. Appl. No. 13/872,018 (15 pages).
Certified English Translation of Murai et al., JP 4496852 B2, May 4, 2023 (16 pages).
Declaration of P. Morgan Pattison, Exhibit 1003 in Petition for Inter Partes Review for U.S. Pat. No. 9,818,803, Case No. IPR 2023-00987, dated Jun. 21, 2023 (128 pages).
Declaration of P. Morgan Pattison, Exhibit 1003 in Petition for Inter Partes Review for U.S. Pat. No. 10,854,683, Case No. IPR 2023-00988, dated Jun. 21, 2023 (126 pages).
Declaration of P. Morgan Pattison, Exhibit 1003 in Petition for Inter Partes Review for U.S. Pat. No. 11,594,578, Case No. IPR 2023-01075, dated Jun. 21, 2023 (128 pages).
Excerpt from Complainant's Opening Claim Construction Brief before the United States International Trade Commission, ITC Investigation No. 337-TA-1351, dated Jun. 13, 2023 (12 pages).

(56) References Cited

OTHER PUBLICATIONS

Explanation of Evidence in Petition to Invalidate JP Patent No. 6672194, dated Apr. 28, 2023 (2 pages).
Explanation of Evidence in Petition to Invalidate JP Patent No. 6748268, dated Apr. 28, 2023 (3 pages).
Galaxy S4 Images, attached to the Petition to Invalidate JP Patent No. 6748268, dated Apr. 28, 2023 (1 page).
Notice of Delivery of a Petition to Invalidate JP Patent No. 6672194, dated Jun. 27, 2023 (1 page).
Notice of Delivery of a Petition to Invalidate JP Patent No. 6748268, dated Jun. 27, 2023 (1 page).
Organic EL Book pages, Published 2015 (3 pages).
Petition for Inter Partes Review for U.S. Pat. No. 10,854,683, Case No. IPR 2023-00988, dated Jun. 21, 2023 (85 pages).
Patent Owner's Preliminary Response to Petition for Inter Partes Review for U.S. Pat. No. 10,854,683, Case No. IPR2023-00988, dated Oct. 16, 2023 (72 pages).
Petition for Inter Partes Review for U.S. Pat. No. 11,594,578, Case No. IPR 2023-01075, dated Jun. 21, 2023 (91 pages).
Patent Owner's Preliminary Response to Petition for Inter Partes Review for U.S. Pat. No. 11,594,578, Case No. IPR2023-01075, dated Oct. 12, 2023 (69 pages).
Petition for Inter Partes Review for U.S. Pat. No. 9,818,803, Case No. IPR 2023-00987, dated Jun. 21, 2023 (90 pages).
Patent Owner's Preliminary Response to Petition for Inter Partes Review for U.S. Pat. No. 9,818,803, Case No. IPR2023-00987, dated Oct. 10, 2023 (73 pages).
Petition to Invalidate JP Patent No. 6672194, dated Apr. 28, 2023 (39 pages).
Petition to Invalidate JP Patent No. 6748268, dated Apr. 28, 2023 (48 pages).
Samsung Galaxy S4 Product Information, attached to the Petition to Invalidate JP Patent No. 6748268, dated Apr. 28, 2023 (5 pages).
Samsung Galaxy S4 Product Listing, attached to the Petition to Invalidate JP Patent No. 6748268, dated Apr. 28, 2023 (7 pages).
Decision Granting Institution of Inter Partes Review Case No. IPR2023-01075 of U.S. Pat. No. 11,594,578 B2, dated Jan. 8, 2024, 49 pages.
Decision Granting Institution of Inter Partes Review Case No. IPR2023-00988 of U.S. Pat. No. 10,854,683 B2, dated Jan. 8, 2024, 49 pages.
Decision Granting Institution of Inter Partes Review Case No. IPR2023-00987 of U.S. Pat. No. 9,818,803 B2, dated Jan. 8, 2024, 54 pages.
U.S. Notice of Allowance dated Feb. 7, 2024, issued in U.S. Appl. No. 18/296,330 (8 pages).
U.S. Office Action dated Feb. 15, 2024, issued in U.S. Appl. No. 17/396,613 (38 pages).
U.S. Notice of Allowance dated Mar. 1, 2024, issued in U.S. Appl. No. 17/396,582 (8 pages).

\* cited by examiner

PIXEL ARRANGEMENT STRUCTURE FOR ORGANIC LIGHT EMITTING DISPLAY DEVICE

CROSS-REFERENCE TO RELATED PATENT APPLICATIONS

This application is a continuation of U.S. patent application Ser. No. 16/505,536, filed Jul. 8, 2019, which is a continuation of U.S. patent application Ser. No. 15/811,599, filed Nov. 13, 2017, now U.S. Pat. No. 10,854,683, which is a continuation of U.S. patent application Ser. No. 13/614,197, filed Sep. 13, 2012, now U.S. Pat. No. 9,818,803, which claims priority to and the benefit of Korean Patent Application No. 10-2012-0022967, filed Mar. 6, 2012, the entire content of all of which is incorporated herein by reference.

BACKGROUND

1. Field

Aspects of embodiments of the present invention relate generally to a pixel arrangement structure of an organic light emitting diode (OLED) display.

2. Description of the Related Art

A display device is a device that displays an image. Recently, an OLED display has been drawing attention. The OLED display has a self-luminous characteristic. Because the OLED display does not need a separate light source, unlike a liquid crystal display, it can have a relatively smaller thickness and weight than liquid crystal displays. In addition, the OLED display exhibits high-quality characteristics such as low power consumption, high luminance, high response speed, etc.

In general, the OLED display includes a plurality of pixels for emitting light of different colors. The plurality of pixels emit light to display an image. Here, the pixel refers to a minimum unit for displaying the images. For instance, there may be a gate line, a data line, and a power line such as a driving power line to drive each pixel. In addition, there may be an insulation layer such as a pixel definition layer to define an area and a shape of each pixel. Further, each pixel may be positioned between its neighboring pixels.

An organic emission layer included in the pixel of an OLED display may be deposited and formed by using a mask such as a fine metal mask (FMM). When reducing a gap between the neighboring pixels to obtain a high aperture ratio of the pixel, deposition reliability may be deteriorated. On the other hand, when increasing the gap between the pixels to improve the deposition reliability, the aperture ratio of the pixel may be deteriorated.

The above information disclosed in this Background section is only for enhancement of understanding of the background of the invention. Therefore, it may contain information that does not form the prior art that is already known in this country to a person of ordinary skill in the art.

SUMMARY

Aspects of embodiments of the present invention relate generally to a pixel arrangement structure of an OLED display. More particularly, aspects relate to a pixel arrangement structure of an OLED display for displaying images by emitting light through a plurality of pixels. An exemplary embodiment of the present invention provides a pixel arrangement structure for an OLED display having an improved aperture ratio of a pixel while efficiently setting up a gap between the pixels.

According to an exemplary embodiment of the present invention, a pixel arrangement structure of an organic light emitting diode display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

The second pixel may include a pair of second pixels. The second pixels may be separated from each other by the first pixel.

The third pixel may include a pair of third pixels. The third pixels may be separated from each other by the first pixel.

The second pixels and the third pixels may enclose the first pixel in the virtual square.

The first pixel, the second pixels, and the third pixels may have polygonal shapes. The second pixels and the third pixels may have a larger area than the first pixel.

The first pixel may have a quadrilateral shape. The second pixels and the third pixels may have hexagonal or octagonal shapes.

The second pixels and the third pixels may have octagonal shapes.

The second pixels and the third pixels may have a same area. A distance between the first pixel and the second pixels, a distance between the first pixel and the third pixels, and a distance between the second pixels and the third pixels may be a same first length.

The first pixel may include a plurality of first pixels. The plurality of first pixels may have a same quadrilateral shape. A distance between neighboring ones of the plurality of first pixels may be a second length that is longer than the first length.

The second pixels may have a larger area than the third pixels. A distance between the second pixels and the third pixels may be a first length. A distance between the first pixel and the second pixels, and a distance between the first pixel and the third pixels may be a same second length.

The first pixel may include a plurality of first pixels. The plurality of first pixels may have a same quadrilateral shape. A distance between neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other. A distance between the neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other.

The second pixels may have a larger area than the third pixels.

The third pixels may have a larger area than the second pixels.

The first pixel, the second pixel, and the third pixel may be configured to emit different color lights.

The first pixel, the second pixel, and the third pixel may be configured to emit green light, blue light, and red light, respectively.

According to an exemplary embodiment of the present invention, the pixel arrangement structure of the OLED display improves the aperture ratio of the pixel while efficiently setting up the gap between the pixels.

DETAILED DESCRIPTION

Figure 1:
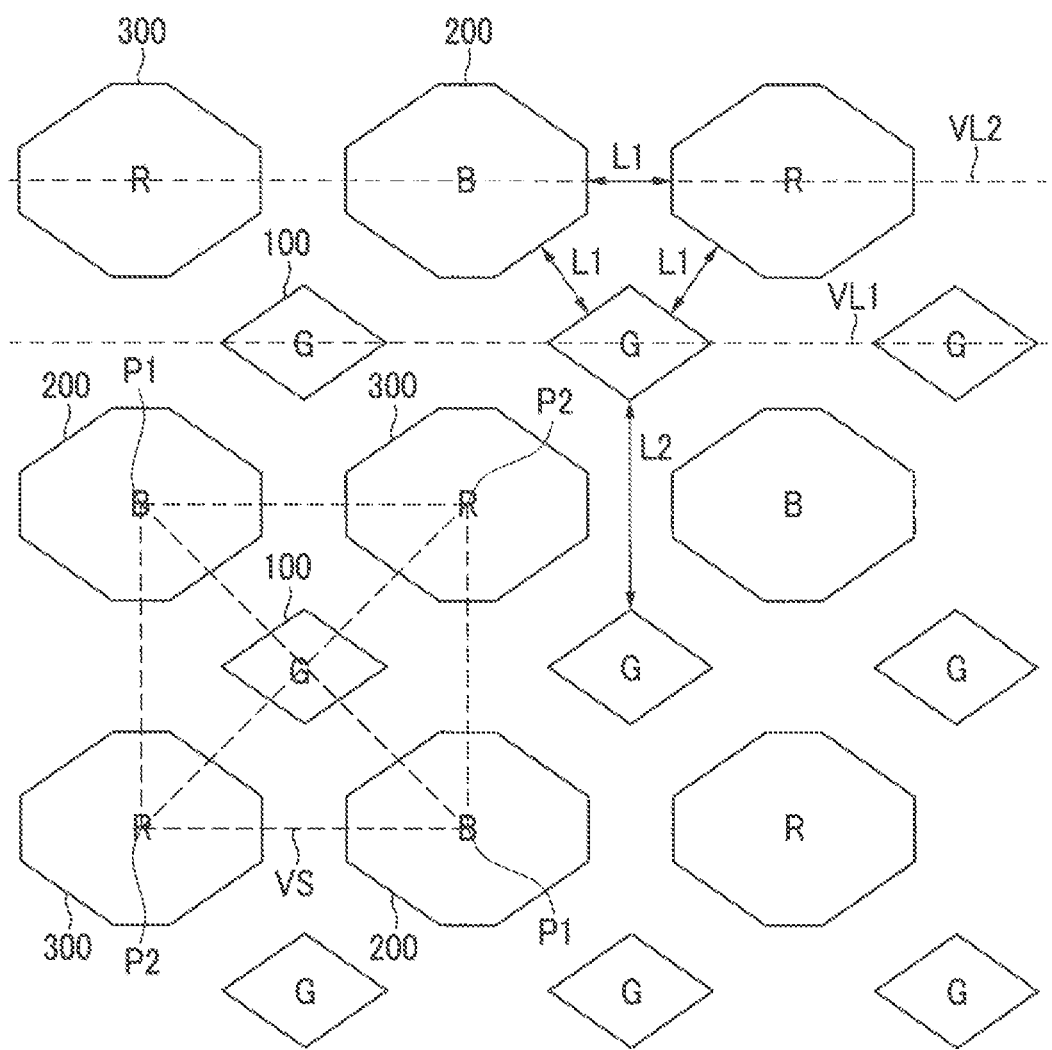
FIG. 1 is a view of a pixel arrangement structure of an OLED display according to a first exemplary embodiment.

Several exemplary embodiments according to the present invention are described hereinafter in detail with reference to the accompanying drawings to allow one of a person of ordinary skill in the art to practice the invention without undue experimentation. The present invention can be embodied in several different forms, and is not limited to exemplary embodiments that are described herein.

In order to clarify the description of embodiments of the present invention, parts that are not related to the embodiments may be omitted. In addition, the same elements or equivalents are referred to with the same reference numerals throughout the specification. For example, the same reference numerals are used for the elements having the same constructions throughout. Such elements are representatively described in a first exemplary embodiment, and in remaining exemplary embodiments, only different constructions from those of the first exemplary embodiment may be described.

Further, since sizes and thicknesses of constituent members shown in the accompanying drawings are arbitrarily given for better understanding and ease of description, the present invention is not limited to the illustrated sizes and thicknesses. In addition, unless explicitly described to the contrary, the word "comprise" and variations such as "comprises" or "comprising" will be understood to imply the inclusion of stated elements but not the exclusion of any other elements.

Nevertheless, even though each of the pixels are drawn as stereotypical polygonal shapes in the drawings, the present invention is not limited to this shape. That is, the shapes of the pixels may be modified to avoid interference with the other components of the OLED (e.g., wirings) within the spirit and scope of the appended claims.

A pixel arrangement structure (or pixel arrangement) of an OLED display according to a first exemplary embodiment will be described with reference to FIG. 1. FIG. 1 is a view schematically showing a portion of pixels forming an OLED display.

As shown in FIG. 1, the pixel arrangement structure of the OLED display includes a plurality of first pixels 100, a plurality of second pixels 200, and a plurality of third pixels 300. Here, the pixel refers to a minimum unit for displaying an image (for example, the minimum addressable unit of the display).

Further, among the first pixels 100, the second pixels 200, and the third pixels 300, power lines for driving each of the pixels, such as a gate line, a data line, a driving power line, and the like, may be located. In addition, an insulation layer, such as a pixel defining layer, for defining each of the pixels may be disposed. Finally, an OLED including an anode, an organic emission layer, and a cathode to correspond to each of the first pixels 100, the second pixels 200, and the third pixels 300 may be disposed. These configurations are technologies known in the art and further description thereof is omitted for ease of description. A shape of each of the pixels may be defined by the power lines, the pixel defining layer, the anode, or the like, but is not limited thereto.

In the pixel arrangement of FIG. 1, each of the first pixels 100 has a smaller area than neighboring second pixels 200 and third pixels 300, and has a quadrilateral (i.e., four-sided) shape among polygon shapes. For example, in the pixel arrangement of FIG. 1, each of the first pixels 100 has the same quadrilateral shape (e.g., a square or rhombus). The first pixels 100 are spaced apart from each other and arranged in rows, such as along a first virtual straight line VL1. The first pixels 100 emit green light, and may include an organic emission layer for emitting green light.

The second pixels 200 are arranged diagonally with respect to the first pixels 100, such as at first vertices P1 along one diagonal of a virtual square VS having one of the first pixels 100 as a center point (or center) of the virtual square VS. In a similar fashion, the third pixels 300 are arranged diagonally with respect to the first pixels 100, such as at second vertices P2 along the other diagonal of the virtual square VS.

In the virtual square VS, each of the second pixels 200 is separated from the first pixel 100, and is centered at one of the first vertices P1 of the virtual square VS. Each of the second pixels 200 has a larger area than the neighboring first pixel 100 and has an octagonal (i.e., eight-sided) shape. In FIG. 1, the second pixels 200 each have the same octagonal shape. In addition, the second pixels 200 are arranged diagonally and separated from each other by the first pixels 100. The second pixels 200 emit blue light, and may include an organic emission layer for emitting blue light.

In a similar fashion, in the virtual square VS, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and the same area as each of the second pixels 200. Further, the third pixels have an octagonal shape (e.g., similar to or the same as the second pixels 200). In FIG. 1, the third pixels 300 each have the same octagonal shape. In addition, the third pixels 300 are arranged diagonally and separated from each other by the first pixels 100. The third pixels 300 emit red light, and may include an organic emission layer for emitting red light.

The third pixels 300 and the second pixels 200 are spaced apart from each other and alternately arranged in rows, such as along a second virtual straight line VL2. In a similar fashion, the third pixels 300 and the second pixels 200 are spaced apart from each other and alternately arranged in columns. Accordingly, in the virtual square VS, two of the second pixels 200 having their corresponding centers positioned at the first vertices P1 and two of the third pixels 300 having their corresponding centers positioned at the second vertices P2 to enclose a corresponding one of the first pixels 100 (e.g., in the virtual square VS).

As described above, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Moreover, the second pixels 200 and the third pixels 300 each have the same area.

As a non-limiting example, the distance (e.g., a shortest distance) between one of the first pixels 100 and an adjacent one of the second pixels 200 is a first length L1, the distance between one of the first pixels 100 and an adjacent one of the third pixels 300 is the same first length L1, and the distance between one of the second pixels 200 and an adjacent one of the third pixels 300 is the same first length L1, as shown in FIG. 1. In addition, the distance (e.g., a shortest distance) between the neighboring first pixels 100 is a second length L2 that is longer than the first length L1. It should be noted that L1, L2, L3, . . . may be used throughout to represent shortest distances between corresponding pixels.

Therefore, the gap of the first length L1 is formed between adjacent pairs of the first pixels 100 and the second pixels 200, between adjacent pairs of the first pixels 100 and the third pixels 300, and between adjacent pairs of the second pixels 200 and the third pixels 300. In addition, the gap of the second length L2 that is longer than the first length L1 is formed between the neighboring ones of the first pixels 100. This results in improved deposition reliability when using a fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, a manufacturing time and manufacturing cost of the entire OLED display may be reduced and the display quality of the image of the OLED display may be improved.

As described above, in the pixel arrangement structure of the OLED display of FIG. 1, the first pixels 100, the second pixels 200, and the third pixels 300 have polygonal shapes (e.g., the first pixels have a quadrilateral shape and the second pixels 200 and the third pixels 300 have an octagonal shape). In addition, it is worth considering that the deposition process of the organic emission layer is one of the unique manufacturing characteristics of the OLED display. Accordingly, to improve the deposition reliability of the organic emission layer in the deposition process using the fine metal mask and to improve the aperture ratio of the first pixels 100, the second pixels 200, and the third pixels 300, the center of each of the first pixels 100 is positioned at the center of a virtual square VS formed by a first pair of diagonal vertices P1 and a second pair of diagonal vertices P2. In the virtual square VS, the centers of a pair of the second pixels 200 are positioned at the first vertices P1, and the centers of a pair of the third pixels 300 are positioned at the second vertices P2.

In addition, in the pixel arrangement structure of the OLED display of FIG. 1, the first pixels 100, the second pixels 200, and the third pixels 300 respectively emit green, blue, and red light. However, in pixel arrangement structures of other OLED displays, the first pixels 100, the second pixels 200, and the third pixels 300 may emit light of different colors. For example, at least one of the second pixels 200 or the third pixels may emit white light.

Next, a pixel arrangement structure of an OLED display according to a second exemplary embodiment will be described with reference to FIG. 2. Parts that are different from the exemplary embodiment of FIG. 1 will be described, while the description of parts that are equivalent to the first exemplary embodiment may be omitted. For better comprehension and ease of description, constituent elements of the second exemplary embodiment that are the same as or similar to those of the first embodiment of FIG. 1 will have the same reference numerals.

Figure 2:
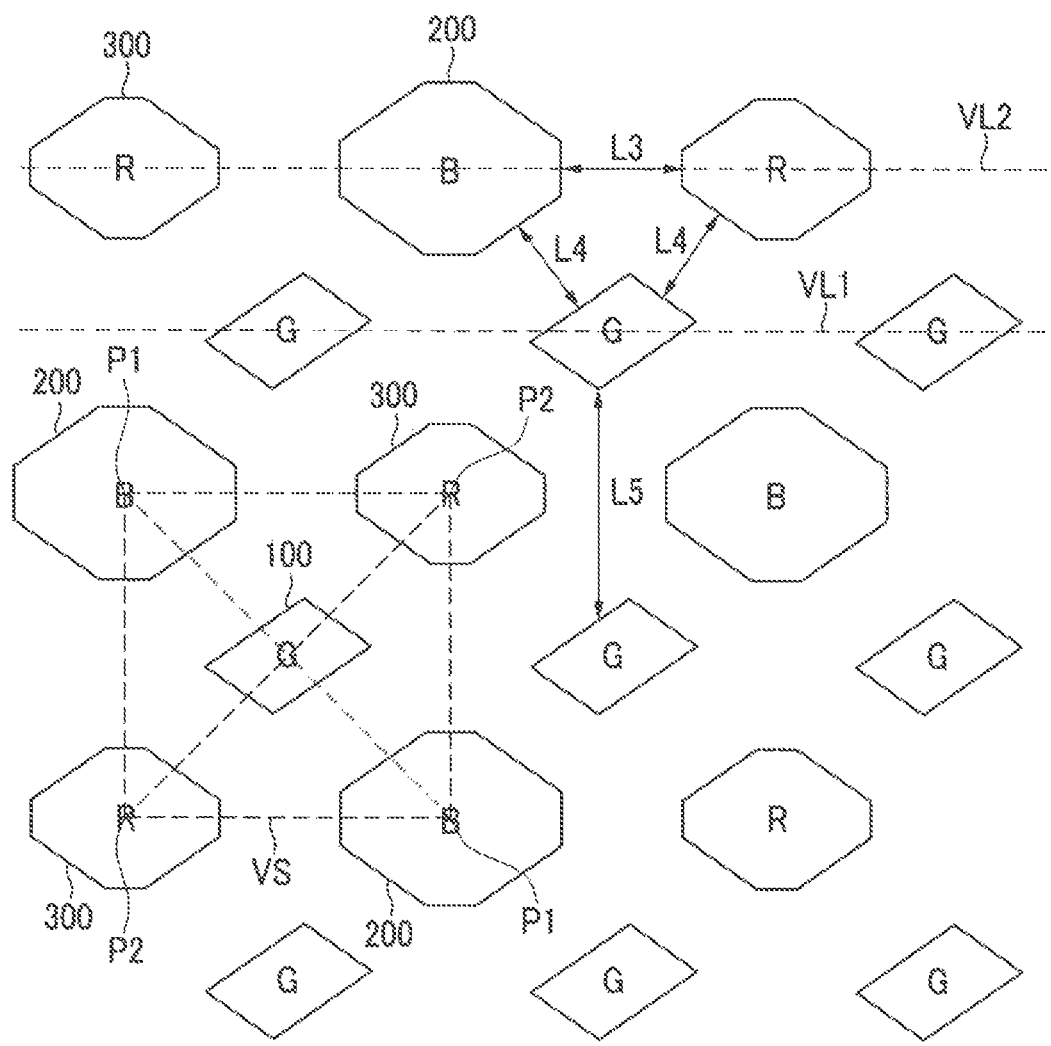
FIG. 2 is a view of a pixel arrangement structure of an OLED display according to a second exemplary embodiment.

As shown in FIG. 2, the pixel arrangement structure of the OLED display includes a plurality of first pixels 100, a plurality of second pixels 200, and a plurality of third pixels 300. The plurality of first pixels 100 have the same quadrilateral shape (e.g., a parallelogram). In addition, the second pixels 200 have a larger area than the third pixels 300. The second pixels 200 and the third pixels 300 may have polygonal shapes, such as octagonal or hexagonal (i.e., six-sided).

In a similar fashion to that of FIG. 1, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 2, the second pixels 200 have a larger area than the third pixels 300.

As a non-limiting example, the distance between adjacent ones of the second pixels 200 and the third pixels 300 is a third length L3, while the distance between each of the first pixels 100 and adjacent ones of the second pixels 200 or the third pixels 300 have a same fourth length L4. In addition, the distance between neighboring ones of the first pixels 100 is a fifth length L5 that is longer than the third length L3 and the fourth length L4.

Accordingly, the gap of the fourth length L4 is formed between adjacent pairs of the first pixels 100 and the second pixels 200, and between adjacent pairs of the first pixels 100 and the third pixels 300. In addition, the gap of the third length L3 is formed between adjacent pairs of the second pixels 200 and the third pixels 300. Further, the gap of the fifth length L5 that is longer than the third length L3 and the fourth length L4 is formed between the neighboring ones of the first pixels 100. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 2, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display of FIG. 2 provides improved life span.

Next, a pixel arrangement structure of an OLED display according to a third exemplary embodiment will be described with reference to FIG. 3. Parts that are different from the above exemplary embodiments will be described, while the description of parts that are equivalent to the above exemplary embodiments may be omitted. For better comprehension and ease of description, constituent elements of the third exemplary embodiment that are the same as or similar to the above exemplary embodiments will have the same reference numerals.

Figure 3:
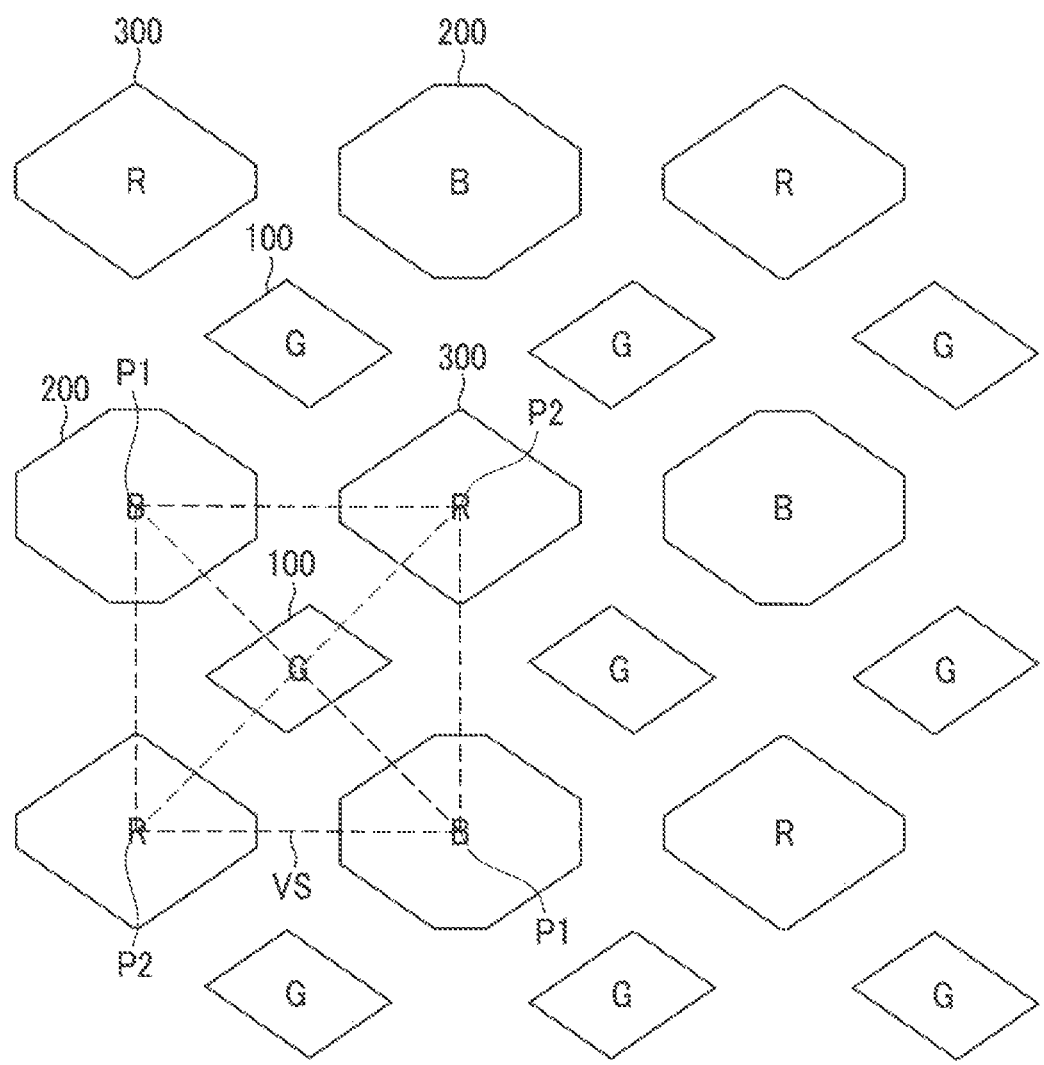
FIG. 3 is a view of a pixel arrangement structure of an OLED display according to a third exemplary embodiment.

As shown in FIG. 3, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the second pixels 200 have a larger area than the third pixels 300. The second pixels 200 and the third pixels may have polygonal shapes (e.g., hexagonal or octagonal).

In a similar fashion to that of FIGS. 1-2, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 3, the neighboring first pixels 100 have a quadrilateral shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by placing each of the first pixels 100 between a pair of the second pixels 200 and between a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 3, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display provides improved life span.

Next, a pixel arrangement structure of an OLED display according to a fourth exemplary embodiment will be described with reference to FIG. 4. Parts that are different from the above exemplary embodiments will be described, while the description of parts that are equivalent to the above exemplary embodiments may be omitted. For better comprehension and ease of description, constituent elements of the fourth exemplary embodiment that are the same as or similar to the above exemplary embodiments will have the same reference numerals.

Figure 4:
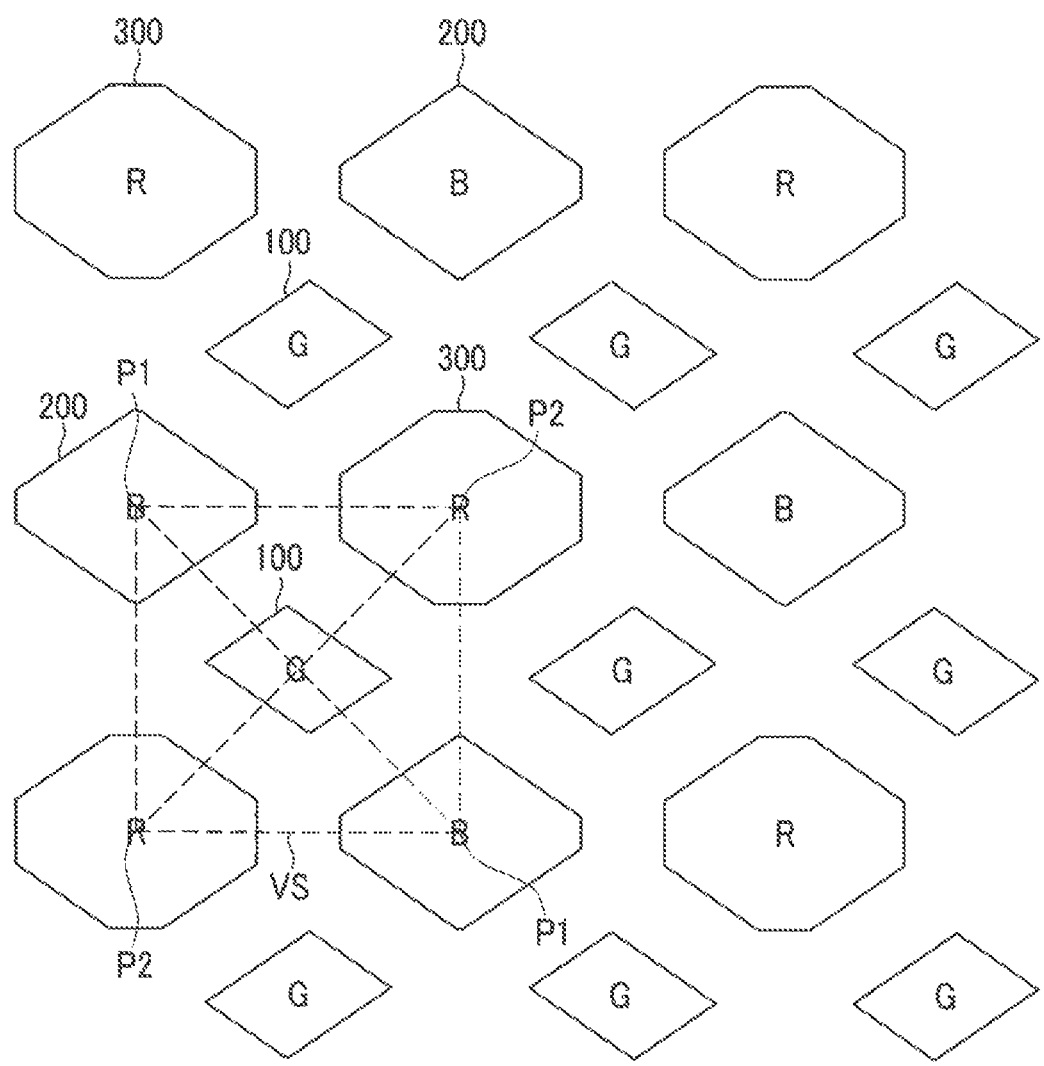
FIG. 4 is a view of a pixel arrangement structure of an OLED display according to a fourth exemplary embodiment.

As shown in FIG. 4, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the third pixels 300 have a larger area than the second pixels 200. The second pixels 200 and the third pixels may have polygonal shapes (e.g., hexagonal or octagonal).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 4, the neighboring first pixels 100 have a quadrilateral shape and are symmetrical to each other, while the third pixels 300 have a larger area than the second pixels 200. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Next, a pixel arrangement structure of an OLED display according to a fifth exemplary embodiment will be described with reference to FIG. 5. Parts that are different from the above exemplary embodiments will be described, while the description of parts that are equivalent to the above exemplary embodiments may be omitted. For better comprehension and ease of description, constituent elements of the fifth exemplary embodiment that are the same as or similar to the above exemplary embodiments will have the same reference numerals.

Figure 5:
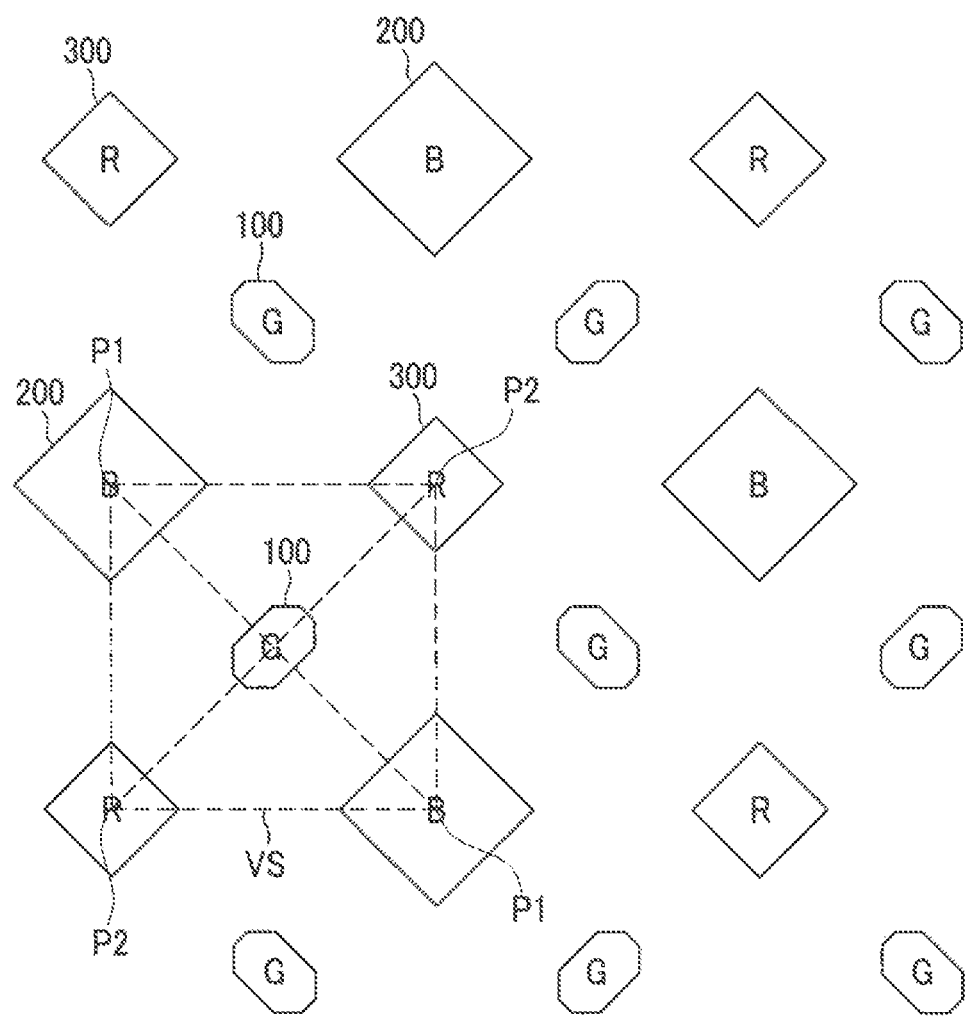
FIG. 5 is a view of a pixel arrangement structure of an OLED display according to a fifth exemplary embodiment.

As shown in FIG. 5, the pixel arrangement structure of the OLED display includes a plurality of first pixels 100, a plurality of second pixels 200, and a plurality of third pixels 300. Among the plurality of first pixels 100, the neighboring first pixels 100 have a octagonal shape and are symmetrical to each other. In addition, the second pixels 200 have a larger area than the third pixels 300. The second pixels 200 and the third pixels 300 may have quadrilateral shapes (e.g., rhombus).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 5, the neighboring first pixels 100 have a octagonal shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS first pixels 100, second pixels 200, third pixels 300

What is claimed is:

1. A pixel arrangement structure of an organic light emitting diode (OLED) display, the pixel arrangement structure comprising a plurality of individually addressable pixels for displaying an image, the individually addressable pixels being minimum addressable units of the OLED display and comprising:
a plurality of first pixels, wherein the first pixels have a shape comprising edges;
a plurality of second pixels; and
a plurality of third pixels,
wherein the OLED display comprises a pixel defining layer defining areas of the first pixels, the second pixels, and the third pixels,
wherein the first pixels, the second pixels, and the third pixels are configured to emit different color lights having respective colors, and
wherein only one of the second pixels or only one of the third pixels is included in a virtual quadrangle containing at least some of the edges of a group of four neighboring ones of the plurality of first pixels, all portions of all others of the second pixels and the third pixels being outside of the virtual quadrangle,
wherein a shortest distance in a direction parallel to any side of the virtual quadrangle between two of the group of four neighboring ones of the plurality of first pixels is greater than a shortest distance between the only one of the second pixels or the only one of the third pixels included in the virtual quadrangle and a nearest one of the second pixels or the third pixels in a direction perpendicular to any side of the virtual quadrangle, and
wherein a pair of first pixels on respective sides of one of the second pixels or the third pixels are symmetric with each other with respect to the one of the second pixels or the third pixels.

2. The pixel arrangement structure of claim 1, wherein the first pixels are configured to emit green light.

3. The pixel arrangement structure of claim 1, wherein the virtual quadrangle does not cross any other of the first pixels, the second pixels, or the third pixels.

4. The pixel arrangement structure of claim 1, wherein each of the first pixels, the second pixels, and the third pixels comprises an anode, a cathode, and an organic emission layer, at least one of the anode, the cathode, or the organic emission layer partially overlapping the pixel defining layer in a plan view.

5. The pixel arrangement structure of claim 1, wherein each of the first pixels, the second pixels, and the third pixels comprises an anode, a cathode, and an organic emission layer, and
wherein the organic emission layer is formed utilizing a fine metal mask.

6. The pixel arrangement structure of claim 1, wherein the first pixels have a shape that is different from a quadrilateral shape.

7. The pixel arrangement structure of claim 1, wherein the edges of each of the first pixels comprise two parallel edges,
wherein a first connecting portion connects respective first ends of the two parallel edges to each other and a second connecting portion connects respective second ends of the two parallel edges to each other, and
wherein a length of at least one of the first connection portion or the second connecting portion is greater than a shortest distance between the two parallel edges.

8. The pixel arrangement structure of claim 1, wherein a shortest distance between two parallel edges from among the edges of one of the group of four neighboring ones of the plurality of first pixels is less than a shortest distance between the one of the group of four neighboring ones of the plurality of first pixels and the only one of the second pixels or the only one of the third pixels included in the virtual quadrangle.

9. The pixel arrangement structure of claim 1, wherein a first pixel of the first pixels is symmetric with respect to at least one of an axis extending in a first direction or an axis extending in a second direction,
wherein the first direction is parallel to a first line extending between a first pair of the group of four neighboring ones of the plurality of first pixels that are on opposite sides of the only one of the second pixels or the only one of the third pixels included in the virtual quadrangle, and
wherein the second direction is parallel to a second line extending between a second pair of the group of four neighboring ones of the plurality of first pixels that are on opposite sides of the only one of the second pixels or the only one of the third pixels included in the virtual quadrangle.

10. The pixel arrangement structure of claim 1, wherein a first pixel of the first pixels has a convex shape with no vertex angle of 90 degrees.

11. The pixel arrangement structure of claim 1, wherein a first pixel of the first pixels has two generally parallel sides that extend in a first direction and completely overlap with each other in a second direction,
wherein the first direction is parallel to a first line extending between a first pair of the group of four neighboring ones of the plurality of first pixels that are on opposite sides of the only one of the second pixels or the only one of the third pixels included in the virtual quadrangle, and
wherein the second direction is parallel to a second line extending between a second pair of the group of four neighboring ones of the plurality of first pixels that are on opposite sides of the only one of the second pixels or the only one of the third pixels included in the virtual quadrangle.

12. The pixel arrangement structure of claim 1, wherein a first pixel of the first pixels has two generally parallel sides that extend in a first direction and connection portions that connect the two generally parallel sides to each other, a length of a first connection portion of the connection portions being greater than a shortest distance between the two generally parallel sides of the first pixel, wherein a line extending in the first direction and bisecting the first connection portion into two portions of equal lengths passes through a center of the first pixel, and
wherein the first direction is parallel to a first line extending between a first pair of the group of four neighboring ones of the plurality of first pixels that are on opposite sides of the only one of the second pixels or the only one of the third pixels included in the virtual quadrangle.

13. The pixel arrangement structure of claim 1, wherein a first pixel of the first pixels has two generally parallel sides that extend in a first direction and connection portions that connect the two generally parallel sides to each other, a length of at least one of the connection portions being greater than a shortest distance between the two generally parallel sides of the first pixel, wherein at least one of the connection portions is symmetric with respect to a line extending in the first direction that passes through a center of the first pixel, and wherein the first direction is parallel to a first line extending between a first pair of the group of four neighboring ones of the plurality of first pixels that are on opposite sides of the only one of the second pixels or the only one of the third pixels included in the virtual quadrangle.

14. The pixel arrangement structure of claim 1, wherein, for each first pixel from among two immediately adjacent ones of the first pixels, a side of the first pixel that faces one of the second pixels immediately adjacent to the first pixel is longer than a side of the first pixel that faces one of the third pixels immediately adjacent to the first pixel.

15. The pixel arrangement structure of claim 1, wherein a total length of edges of one first pixel from among two immediately adjacent ones of the first pixels that face the other first pixel from among the two immediately adjacent ones of the first pixels is equal to a total length of edges of the other first pixel that face the one first pixel.

16. The pixel arrangement structure of claim 1, wherein any two of the first pixels that are immediately adjacent to each other have different maximum widths in at least one of a first direction or a second direction, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

17. The pixel arrangement structure of claim 1, wherein a maximum width of the first pixels in at least one of a first direction or a second direction is different from a maximum width in a same direction of at least one of the second pixels or the third pixels, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

18. The pixel arrangement structure of claim 1, wherein some of the first pixels are aligned with each other and are entirely located within a region extending in a third direction crossing a first direction and a second direction, wherein all of the second pixels and the third pixels are located entirely outside the region, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

19. The pixel arrangement structure of claim 1, wherein some of the first pixels are arranged along a third direction crossing a first direction and a second direction, wherein adjacent ones of the some of the first pixels are mirror symmetric with respect to an axis extending in a fourth direction perpendicular to the third direction, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

20. The pixel arrangement structure of claim 1, wherein each of the first pixels in the pixel arrangement structure has a first width along a major axis parallel to a first direction or a second direction, and a second width along a minor axis perpendicular to the major axis, wherein the second width is less than the first width, and each pair of second pixels from among the second pixels are on opposite sides of the major axis of an adjacent one of the first pixels, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

21. The pixel arrangement structure of claim 1, wherein each pair of sides of the first pixels that are parallel to a second direction and facing adjacent ones of the second pixels is longer than each pair of sides of the first pixels that are parallel to a first direction and facing adjacent ones of the third pixels, wherein the first direction is parallel to a first line extending between a first pair of the group of four neighboring ones of the plurality of first pixels that are on opposite sides of the only one of the second pixels or the only one of the third pixels included in the virtual quadrangle, and wherein the second direction is parallel to a second line extending between a second pair of the group of four neighboring ones of the plurality of first pixels that are on opposite sides of the only one of the second pixels or the only one of the third pixels included in the virtual quadrangle.

22. The pixel arrangement structure of claim 1, wherein each of the first pixels has a convex shape such that a line bisecting the first pixel along a long axis thereof has a greater length than a line bisecting the first pixel along a shortest axis thereof,
   wherein each of the first pixels is located between two adjacent ones of the second pixels along a direction of the shortest axis, and
   wherein each of the first pixels is located between two adjacent ones of the third pixels along a direction of the long axis.

23. An organic light emitting diode (OLED) display comprising a plurality of pixels for displaying an image, the plurality of pixels being individually addressable pixels for displaying an image, the individually addressable pixels being minimum addressable units of the OLED display and comprising:
   a plurality of first pixels to produce light of a first color;
   a plurality of second pixels to produce light of a second color that is different from the first color; and
   a plurality of third pixels to produce light of a third color that is different from the first color and the second color,
   wherein the plurality of pixels is organized into a plurality of first pixel rows and a plurality of second pixel rows that are alternately arranged along a column direction,
   wherein each of the first pixel rows comprises some of the first pixels and some of the second pixels that are alternately arranged along a row direction substantially perpendicular to the column direction,
   wherein each of the second pixel rows comprises some of the first pixels and some of the third pixels that are alternately arranged along the row direction,
   wherein the first pixels in the first pixel rows are entirely outside a region extending in the row direction and completely overlapping, in the column direction, the third pixels in one of the second pixel rows that is adjacent to the first pixel rows,
   wherein a shortest distance between two nearest ones of the first pixels in a third direction crossing the row direction and the column direction is greater than a shortest distance between one of the second pixels and one of the third pixels that are nearest each other in the third direction, and
   wherein a first pixel of the first pixels is symmetric with respect to at least one of an axis extending in the row direction or an axis extending in the column direction.

24. The OLED display of claim 23, wherein the second pixels of the first pixel rows have a first width in the column direction,
   wherein the first pixels of the first pixel rows have a second width in the column direction, and
   wherein the first width is different than the second width.

25. The OLED display of claim 23, wherein the second pixels of the first pixel rows have a first width in the row direction,
   wherein the first pixels of the second pixel rows have a second width in the row direction, and
   wherein the first width is different than the second width.

26. The OLED display of claim 23, wherein:
   the first pixels and the second pixels are alternately arranged along the column direction in a plurality of first pixel columns;
   the first pixels and the third pixels are alternately arranged along the column direction in a plurality of second pixel columns; and
   the first pixel columns and the second pixel columns are alternately arranged along the row direction.

27. The OLED display of claim 26, wherein centers of the first pixels on one of the first pixel columns are aligned in the column direction.

28. The OLED display of claim 26, wherein centers of the first pixels on one of the second pixel columns are aligned in the column direction.

29. The OLED display of claim 26, wherein a shortest distance between neighboring ones of the pixels on the first pixel rows is the same as a shortest distance between neighboring ones of the pixels on the first pixel columns.

30. The OLED display of claim 26, wherein each of the first pixels is at an intersection of one of the first pixel rows and one of the second pixel columns only, or at an intersection of one of the second pixel rows and one of the first pixel columns only.

31. The OLED display of claim 26, wherein centers of corresponding ones of the second pixels are aligned in one of the first pixel rows and in one of the first pixel columns.

32. The OLED display of claim 31, wherein centers of corresponding ones of the third pixels are aligned in one of the second pixel rows and in one of the second pixel columns.

33. The OLED display of claim 32, wherein:
   two neighboring ones of the pixels on one of the first pixel rows and two neighboring ones of the pixels on one of the second pixel rows adjacent to the one of the first pixel rows form a virtual square; and
   only the two neighboring ones of the pixels on the one of the first pixel rows and the two neighboring ones of the pixels on the one of the second pixel rows are in an area of the virtual square.

34. The OLED display of claim 23, wherein:
   each of the first pixel rows comprises a plurality of first pixel groups, each of the first pixel groups consisting of one of the first pixels and one of the second pixels adjacent to the one of the first pixels on a corresponding first pixel row; and
   each of the second pixel rows comprises a plurality of second pixel groups, each of the second pixel groups consisting of one of the first pixels and one of the third pixels adjacent to the one of the first pixels on a corresponding second pixel row.

35. The OLED display of claim 23, wherein centers of corresponding ones of the first pixels on one of the first pixel rows are aligned in the row direction.

36. The OLED display of claim 23, wherein centers of corresponding ones of the first pixels on one of the second pixel rows are aligned in the row direction.

37. The OLED display of claim 23, wherein all of the pixels on the second pixel rows are offset entirely in the column direction from the first pixels on the first pixel rows.

38. The OLED display of claim 23, wherein a shortest distance between neighboring ones of the pixels on the first pixel rows is the same as a shortest distance between neighboring ones of the pixels on the second pixel rows.

39. The OLED display of claim 23, wherein the first color is green, the second color is blue, and the third color is red.

40. The OLED display of claim 23, wherein each of the first pixels has two parallel sides that are elongated in the row direction or the column direction, and two connection portions that connect the two parallel sides to each other at respective ends of the two parallel sides, and
   wherein at least one of the two connection portions has a length that is greater than a shortest distance between the two parallel sides.

41. The OLED display of claim 23, wherein an imaginary line extending in the row direction through upper edges or lower edges of ones of the second pixels overlaps only the ones of the second pixels, the upper edges and the lower edges being defined with respect to the column direction.

42. The OLED display of claim 23, wherein each of the third pixels is larger than any of the first pixels, and wherein each of the second pixels is larger than any of the first pixels and the third pixels.

43. The OLED display of claim 23, wherein a shortest distance between two parallel sides, which are elongated in the row direction, of one of the first pixels is less than a shortest distance between one of the two parallel sides and a nearest one of the second pixels in the column direction.

44. The OLED display of claim 23, wherein the second pixels of the first pixel rows have a first width in the column direction,
wherein the third pixels of the second pixel rows have a third width in the column direction, and
wherein the first width is different than the third width.

45. The OLED display of claim 23, wherein the second pixels of the first pixel rows have a first width in the row direction,
wherein the third pixels of the second pixel rows have a third width in the row direction, and
wherein the first width is different than the third width.

46. The OLED display of claim 23, wherein a pair of first pixels on respective sides of one of the second pixels or the third pixels are symmetric with each other with respect to the one of the second pixels or the third pixels.

47. The OLED display of claim 23, wherein a first pixel of the first pixels has a convex shape with no vertex angle of 90 degrees.

48. The OLED display of claim 23, wherein a first pixel of the first pixels has two generally parallel sides that extend in the row direction and completely overlap with each other in the column direction.

49. The OLED display of claim 23, wherein a first pixel of the first pixels has two generally parallel sides that extend in the row direction and connection portions that connect the two generally parallel sides to each other, a length of a first connection portion of the connection portions being greater than a shortest distance between the two generally parallel sides of the first pixel, wherein a line extending in the row direction and bisecting the first connection portion into two portions of equal lengths passes through a center of the first pixel.

50. The OLED display of claim 23, wherein a first pixel of the first pixels has two generally parallel sides that extend in the row direction and connection portions that connect the two generally parallel sides to each other, a length of at least one of the connection portions being greater than a shortest distance between the two generally parallel sides of the first pixel, wherein at least one of the connection portions is symmetric with respect to a line extending in the row direction that passes through a center of the first pixel.

51. The OLED display of claim 23, wherein, for each first pixel from among two immediately adjacent ones of the first pixels, a side of the first pixel that faces one of the second pixels immediately adjacent to the first pixel is longer than a side of the first pixel that faces one of the third pixels immediately adjacent to the first pixel.

52. The OLED display of claim 23, wherein a total length of edges of one first pixel from among two immediately adjacent ones of the first pixels that face the other first pixel from among the two immediately adjacent ones of the first pixels is equal to a total length of edges of the other first pixel that face the one first pixel.

53. The OLED display of claim 23, wherein any two of the first pixels that are immediately adjacent to each other have different maximum widths in at least one of the row direction or the column direction.

54. The OLED display of claim 23, wherein a maximum width of the first pixels in at least one of the row direction or the column direction is different from a maximum width in a same direction of at least one of the second pixels or the third pixels.

55. The OLED display of claim 23, wherein some of the first pixels are aligned with each other and are entirely located within a region extending in the third direction, and
wherein all of the second pixels and the third pixels are located entirely outside the region.

56. The OLED display of claim 23, wherein some of the first pixels are arranged along the third direction, and
wherein adjacent ones of the some of the first pixels are mirror symmetric with respect to an axis extending in a fourth direction perpendicular to the third direction.

57. The OLED display of claim 23, wherein each of the first pixels in the OLED Display has a first width along a major axis parallel to the row direction or the column direction, and a second width along a minor axis perpendicular to the major axis, and
wherein the second width is less than the first width, and each pair of second pixels from among the second pixels are on opposite sides of the major axis of an adjacent one of the first pixels.

58. The OLED display of claim 23, wherein each pair of sides of the first pixels that are parallel to the row direction and facing adjacent ones of the second pixels is longer than each pair of sides of the first pixels that are parallel to the column direction and facing adjacent ones of the third pixels.

59. The OLED display of claim 23, wherein each of the first pixels has a convex shape such that a line bisecting the first pixel along a long axis thereof has a greater length than a line bisecting the first pixel along a shortest axis thereof,
wherein each of the first pixels is located between two adjacent ones of the second pixels along a direction of the shortest axis, and
wherein each of the first pixels is located between two adjacent ones of the third pixels along a direction of the long axis.

* * * * *